(12) United States Patent
Godambe

(10) Patent No.: US 7,339,442 B2
(45) Date of Patent: Mar. 4, 2008

(54) BASEBAND RC FILTER POLE AND ON-CHIP CURRENT TRACKING SYSTEM

(75) Inventor: Nihal J. Godambe, Palatine, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 145 days.

(21) Appl. No.: 11/176,034

(22) Filed: Jul. 7, 2005

(65) Prior Publication Data

US 2007/0008046 A1    Jan. 11, 2007

(51) Int. Cl.
    H03B 5/20    (2006.01)
(52) U.S. Cl. .................... 331/135; 327/553; 327/554
(58) Field of Classification Search ................ 331/135; 327/553, 554
    See application file for complete search history.

(56) References Cited

U.S. PATENT DOCUMENTS

| | | | |
|---|---|---|---|
| 5,124,593 A * | 6/1992 | Michel | ........................ 327/554 |
| 5,416,438 A | 5/1995 | Shibata | |
| 5,663,675 A | 9/1997 | O'Shaughnessy | |
| 5,914,633 A | 6/1999 | Comino et al. | |
| 6,259,311 B1 | 7/2001 | Azimi et al. | |
| 6,417,727 B1 | 7/2002 | Davis | |
| 6,593,802 B2 * | 7/2003 | Mariani et al. | ............. 327/553 |
| 6,628,163 B2 | 9/2003 | Dathe et al. | |
| 6,646,498 B2 * | 11/2003 | Mohieldin et al. | .......... 327/553 |
| 6,677,814 B2 | 1/2004 | Low et al. | |

* cited by examiner

*Primary Examiner*—Robert Pascal
*Assistant Examiner*—James Goodley
(74) *Attorney, Agent, or Firm*—Brinks, Hofer, Gilson & Lione

(57) ABSTRACT

An apparatus and method are provided for tracking the poles of an integrated RC filter as well as the absolute value of a current source. A single tracking oscillator contains integrated elements such as a programmable resistor and fixed capacitor or a programmable capacitor and fixed resistor. The programmable element is programmed such that a particular response from the RC filter is achieved and the word used to program the programmable element is then supplied to other integrated RC filters having components that were fabricated at the same time as the RC filter in the tracking oscillator. A highly accurate external capacitor or resistor is supplied to determinate the absolute value of the programming element, which is used to program one or more current sources containing the programmable resistor.

20 Claims, 6 Drawing Sheets

BASEBAND RC FILTER POLE AND ON-CHIP CURRENT TRACKING SYSTEM

TECHNICAL FIELD

The present application relates to an apparatus and method of calibrating circuitry. More specifically, the present application relates to an apparatus and method of tracking the poles of RC filters and current tracking in a current source.

BACKGROUND

The variety and use of electronic devices, especially portable electronic devices such as cellular telephones, laptop computers, and personal digital assistants (PDAs), has dramatically increased in recent years. With the increasing number and type of electronic devices, as well as communication formats between different electronic devices, the design of circuits in these electronic devices has become increasingly complex.

Many circuit designs used in electronic devices use integrated filters of various types to enable filtering of signals therethrough. In particular, multiple resistor-capacitor (RC) filters are often used within an integrated circuit. When fabricating the individual resistors and capacitors that form the RC filters, various processes are used. These processes include deposition of one or more metal and/or insulating layers used to form the resistor(s) and capacitor(s) as well as deposition of a photoresist layer, photolithography of the photoresist layer that defines the area of the deposited layer that will be used, etching of the deposited layer, removal of the remaining photoresist and cleaning of the substrate after the photoresist has been removed, among others.

However, variations exist between sets of processes. These variations originate from a variety of sources, such as differences in the thickness of the various layers deposited, the amount of misalignment of masks used during photolithography, etching times and etchant compositions for example. Thus, even though the same processes may be used to fabricate RC filters at different times on the same substrate or may be used to fabricate the same RC filter on different substrates, variations in the processes may cause the resistance and capacitance values of the filters to deviate by up to about 20% from the designed value, which causes the poles on the RC filter to deviate by twice that amount, by 40%. Moreover, since on-chip current sources use integrated resistors, these 20% resistance variations produce a similar variation in the absolute values of currents. Such a substantial deviation may cause significant operation problems unless the deviation is monitored and corrected for (essentially calibrated out) before the final product is shipped to a consumer. A similar deviation may exist over operational temperatures of the circuit, which also needs to be addressed.

DETAILED DESCRIPTION OF THE EMBODIMENTS

An apparatus and method are provided for calibrating the poles of an integrated RC filter as well as the absolute current in an integrated current source. A pole of the RC filter is dependent on the values of the resistance of the resistor and the capacitance of the capacitor used to form the RC filter, while the absolute value of the current source is dependent on the absolute value of a resistor. The poles and absolute resistor value may be tracked over temperature and process variations. The current source may be connectable to the RC filter and used in, for example, a transceiver, serving the purpose of a master bias source which is used throughout the circuitry. The calibration of the poles permits the circuitry to maintain the poles within ±10% of the designed value. As on-chip currents on the integrated circuit can vary by 30-40%, tracking also reduces the current variation, to within ±10%, improving overall circuitry performance and yield.

Figure 1:
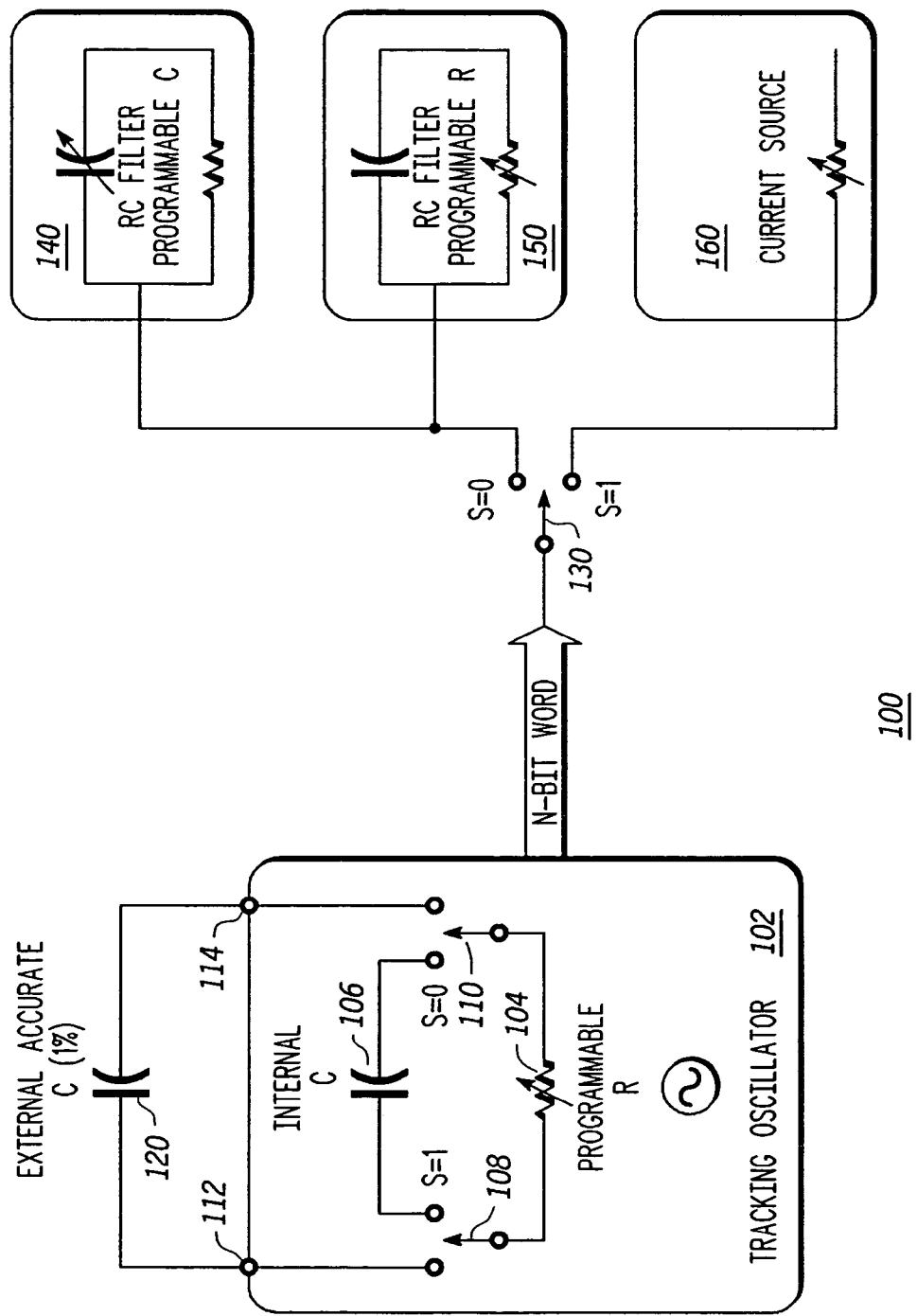
FIG. 1 illustrates a tracking apparatus according to a first embodiment.

FIG. 1 illustrates one embodiment of a tracking apparatus 100 in an integrated circuit. The tracking apparatus 100 contains a tracking oscillator 102 and connections to other circuits. The tracking apparatus 100 is integrated in an integrated circuit fabricated from a wafer. As in general multiple chips are fabricated from each wafer, a tracking oscillator 102 is present on each chip. Preferably, the tracking oscillator 102 is disposed on the wafer relatively close to the circuits it is tracking to minimize possible variations in the connections between the tracking oscillator 102 and the other circuits.

Figure 2:
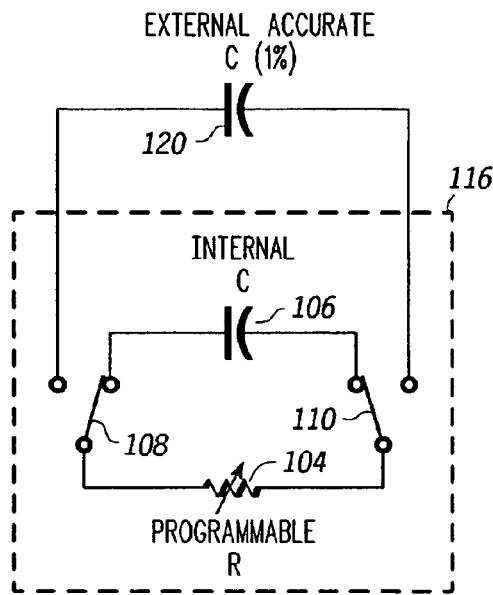
FIG. 2 shows the RC filter of the tracking oscillator of FIG. 1 in a first state.
Figure 3:
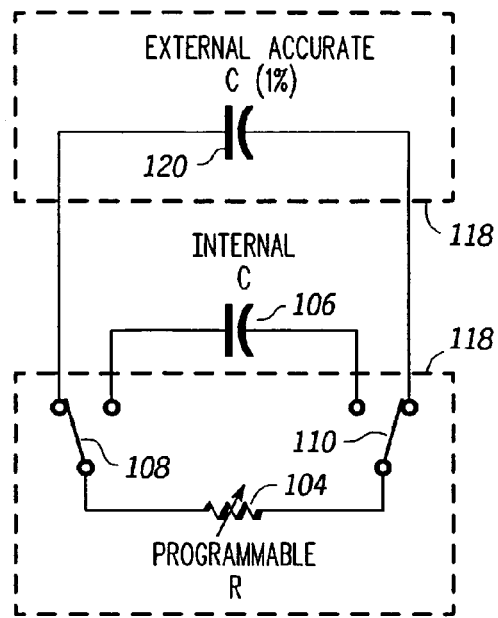
FIG. 3 shows the RC filter of the tracking oscillator of FIG. 1 in a second state.

The tracking oscillator 102 contains a programmable resistor 104, an internal capacitor 106, and a pair of switches 108 and 1 10. The programmable resistor 104 and internal capacitor 106, when connected together by the switches 108 and 110 as shown in FIG. 2, form an internal RC filter 116. Similarly, the programmable resistor 104 and an external capacitor 120, when connected together by the switches 106 and 108 as shown in FIG. 3, form a hybrid RC filter 118.

As shown in FIG. 1, the tracking oscillator 102 is connectable to other programmable RC filters 140 and 150 or to one or more programmable current sources 160 through a switch 130. The resistors and capacitors in the other programmable RC filters 140 and 150 are all fabricated at the same time, using the same processes as the programmable resistor 104 and internal capacitor 106 of the internal RC filter 116. Thus, there is little if any variation between the characteristics of the resistors and capacitors in the other programmable RC filters 140 and 150 and the programmable resistor 104 and internal capacitor 106 of the internal RC filter 116.

Also, the programmable current source 160 uses a resistor that is fabricated at the same time, using the same processes as the programmable resistor 104 in the internal RC filter 116 and hybrid RC filter 118. Thus, there is little if any variation between the characteristics of the resistor in the programmable current source 160 and the programmable resistor 104 in the tracking oscillator 102. In the embodiment shown, the programmable current source 160 does not use a capacitor that is fabricated at the same time, using the same processes as the internal capacitor 106 of the internal RC filter 116.

The switch 130 is controlled by the same signal that controls the switches 108 and 110 in the tracking oscillator 102. The switch 130 switches the connection between the tracking oscillator 102 and the other programmable RC filters 140 and 150 when the programmable resistor 104 and internal capacitor 106 are connected together to form the internal RC filter 116. Similarly, the tracking oscillator 102 is connected to the programmable current source 160 when the programmable resistor 104 and the external capacitor 120 are connected together to form the hybrid RC filter 118.

When the tracking oscillator 102 and the other programmable RC filters 140 and 150 are connected together, the tracking oscillator 102 provides a first N-bit (where n is an integer such as 3 or 4 bit) word to the other programmable RC filters 140 and 150. A word sets the value of an element to which it is supplied. As the time constant of RC filters are proportional to the product of the resistance and the capacitance, varying the resistance or capacitance of the programmable RC filters 140 and 150 is substantially equivalent. In other words, although the resistance of the programmable resistor 104 is varied in the tracking oscillator 102, the value of either the resistor or capacitor in the programmable RC filters 140 and 150 may be varied by the same amount to achieve the same electrical result. Similarly, when the tracking oscillator 102 is connected to the programmable current source 160, the tracking oscillator 102 provides a second N-bit word to the programmable current source 160.

The external capacitor 120 is an individual component connected to input/output terminals 112 and 114 of the tracking oscillator 102. The external capacitor 120 is extremely accurate (about <1%), that is, the value of the capacitance does not vary by more than about 1% from the stated capacitance of the external capacitor 120. This permits the hybrid RC filter 118 to contain at least one component whose value is precise (capacitor) and thereby track the values of the programmable current source 160, through the programmable resistor, as described below.

Figure 4:
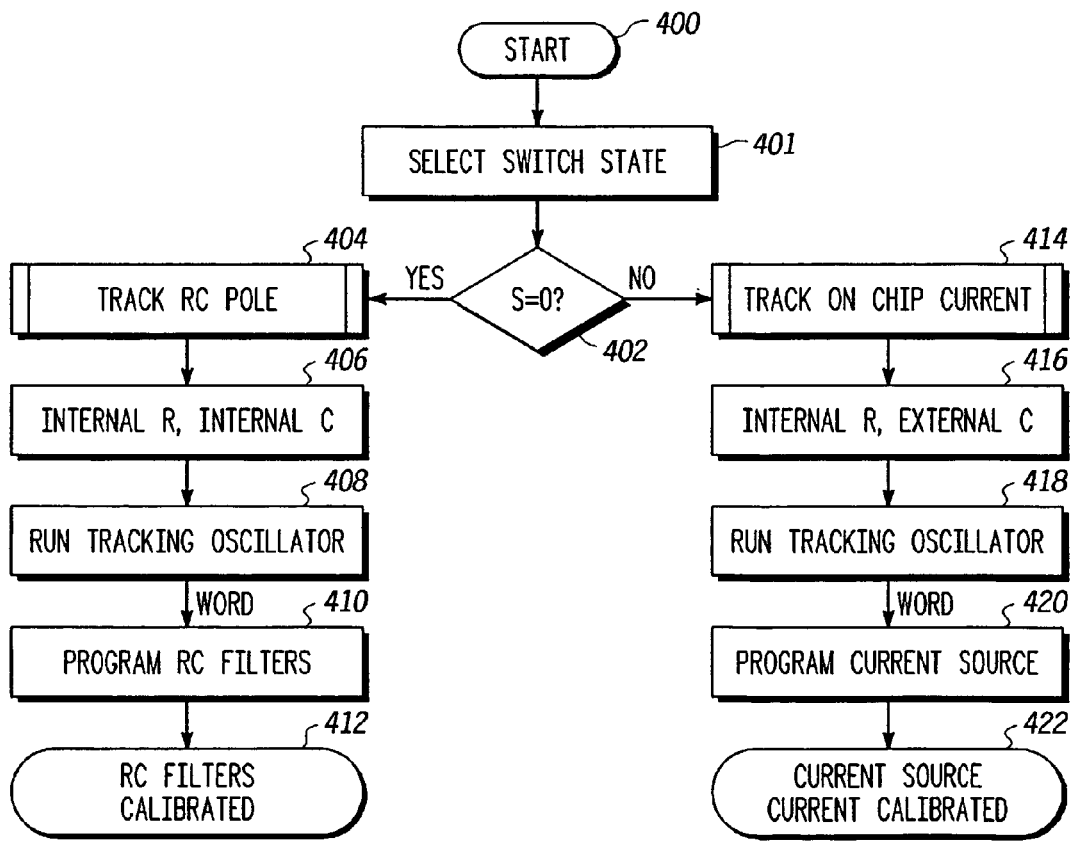
FIG. 4 is a flowchart of operation of the tracking apparatus according to the first embodiment.

FIG. 4 illustrates one embodiment of a method of tracking the poles of the other programmable RC filters 140 and 150 as well as a method of tracking current in the programmable current source 160. As shown, after the start in block 400 of the tracking process, the positions of switches 108, 110, and 130 are selected in block 401. The positions of the switches 108, 110, and 130 may be selected either by being encoded in hardware (for example in a finite state machine) or reprogrammed each time a particular type of circuit is to be tracked. If the switches 108, 110, and 130 are in a first state (shown as S=0) in block 402, the poles of the RC filters 140 and 150 are tracked in block 404.

To track the poles, the programmable resistor 104 and internal capacitor 106 are connected together so that the internal RC filter 116 is formed in block 406. The tracking oscillator 102 is then operated 408 to vary the resistance of the programmable resistor 104 and determine the value of the poles in the internal RC filter 116. In one embodiment, the value of the programmable resistor 104 is adjusted until the internal RC filter 116 has the desired response to an input signal.

Figure 5:
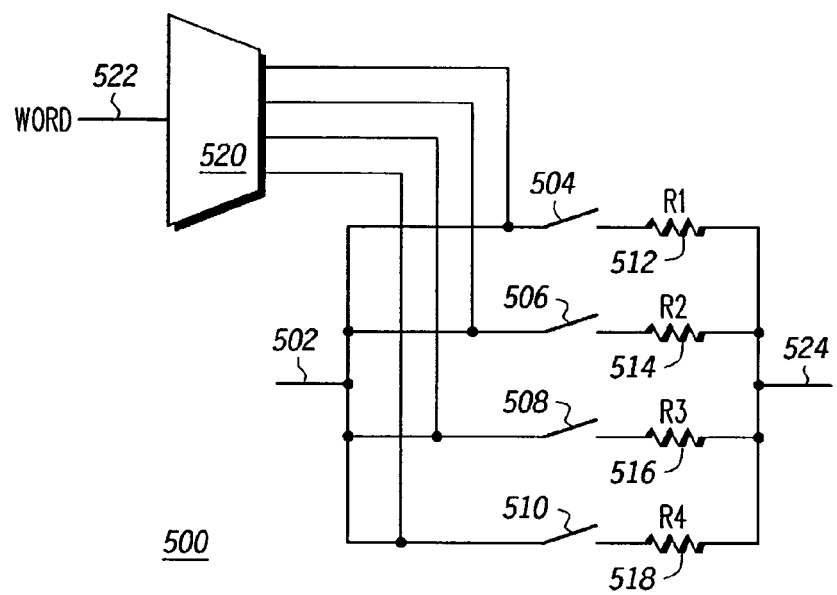
FIG. 5 shows a programmable resistor according to the first embodiment.

One embodiment of the programmable resistor 104 is shown in FIG. 5. As shown in FIG. 5, the programmable resistor 500 contains an input 502 and an output 524, between which a set of resistors 512, 514, 516, and 518 are connected in parallel with each other. The resistors 512, 514, 516, and 518 can have the same value as another resistor in the set or different values. A switch 504, 506, 508, and 510 is series with each of the resistors 512, 514, 516, and 518, respectively. The switches 504, 506, 508, and 510 are controlled by a demultiplexer 520. More specifically, a word of a predetermined number of bits is supplied to the input 522 of the demultiplexer 520. In response, the demultiplexer 520 controls the state of each of the switches 504, 506, 508, and 510 to be open or closed, thereby adjusting the total resistance between the input 502 and output 524 of the programmable resistor 500.

The resistance of the programmable resistor 500 can be adjusted in any suitable manner to obtain the proper resistance and thus the desired characteristics of the RC filter. For example, the resistance can start at a value such as a minimum or maximum and be incrementally changed or the resistance can start at a value between the minimum and maximum and be adjusted using a binary search pattern (in which the resistance is altered to jump to a value half way between the last resistance used and the highest/lowest useable resistance).

Once the desired RC characteristics for the internal RC filter 116 are obtained using the appropriate word, the same word is supplied to the other programmable RC filters 140 and 150 in block 410 of FIG. 4. As the other programmable RC filters 140 and 150 have the same characteristics as the internal RC filter 116, all of the other programmable RC filters 140 and 150 are thus programmed to have the same characteristics as the internal RC filter 116 and are thus calibrated in block 412.

If the switches 108, 110, and 130 are in a second state (shown as S=1), however, the chip current is tracked in block 414 to calibrate current in the programmable current source 160. In this case, the programmable resistor 104 and external capacitor 120 are connected together so that the hybrid RC filter 118 is formed in block 416. The highly accurate external capacitor 120 is used since the programmable current source 160 only contains the resistor that is fabricated using the same processes as the programmable resistor 104. Thus, the highly accurate external capacitor 120 eliminates the variations in the characteristics of the RC filter used to program the current source 160 caused by variations in the capacitance of the internal capacitor 106, thereby permitting the variation of the programmable resistor 104 only to be obtained.

Accordingly, the tracking oscillator 102 is operated in block 418 to vary the resistance of the programmable resistor 104 and determine the value of the poles in the hybrid RC filter 118 in a manner similar to determining the value of the poles in the internal RC filter 116 above. Once the desired RC characteristics for the hybrid RC filter 118 are obtained using the appropriate word, this word is also supplied in block 420 to the programmable current source 160. This calibrates the programmable current source 160 in block 422.

Figure 6:
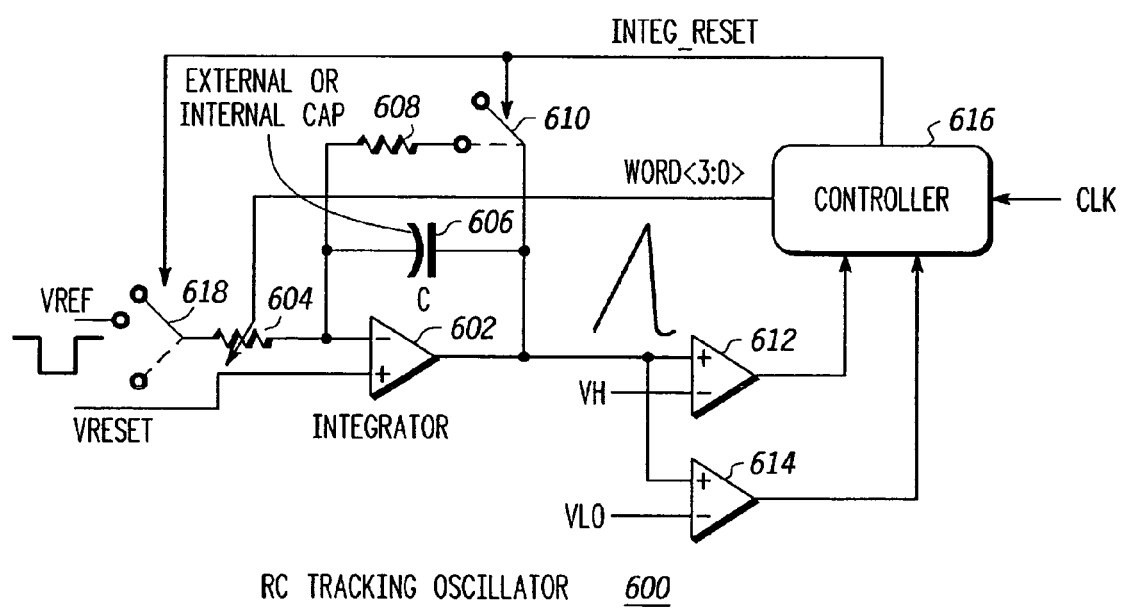
FIG. 6 shows a tracking oscillator according to the first embodiment.

FIG. 6 illustrates an embodiment of a tracking oscillator 600. The tracking oscillator 600 contains an integrator 602, the programmable resistor 604 (also referred to as supply resistor), a capacitor 606, a feedback resistor 608, a first reset switch 610, a pair of comparators 612 and 614 (first and second comparators), a controller 616, and a second reset switch 618.

The integrator 602 and comparators 612 and 614, in one embodiment, are operational amplifiers (op-amps). A predetermined reset voltage Vreset is applied to the non-inverting input of the integrator 602 and a reference pulse Vref is applied to the inverting input of the integrator 602 through the second reset switch 618 and the programmable resistor 604. The capacitor 606 is connected between the output and the inverting input of the integrator 602 to provide feedback. The capacitor 606 is either the internal capacitor 106 or the external capacitor 120. In addition, a series circuit containing the feedback resistor 608 and the first reset switch 610 is connected in parallel with the capacitor 606 between the output and the inverting input of the integrator 602.

The output of the integrator 602 is supplied to the non-inverting inputs of the comparators 612 and 614. A predetermined high transition voltage Vh is supplied to the inverting input of the first comparator 612 and a predetermined low transition voltage Vlo is supplied to the inverting input of the second comparator 614. The output of the first and second comparators 612 and 614 are supplied to the controller 616. A clock signal CLK is also supplied to the controller 616. In response to the clock signal CLK and the outputs from the first and second comparators 612 and 614, the controller 616 supplies the word to the programmable resistor 604 and a reset signal Integ_reset to the first and second reset switches 610 and 618.

Figure 8:
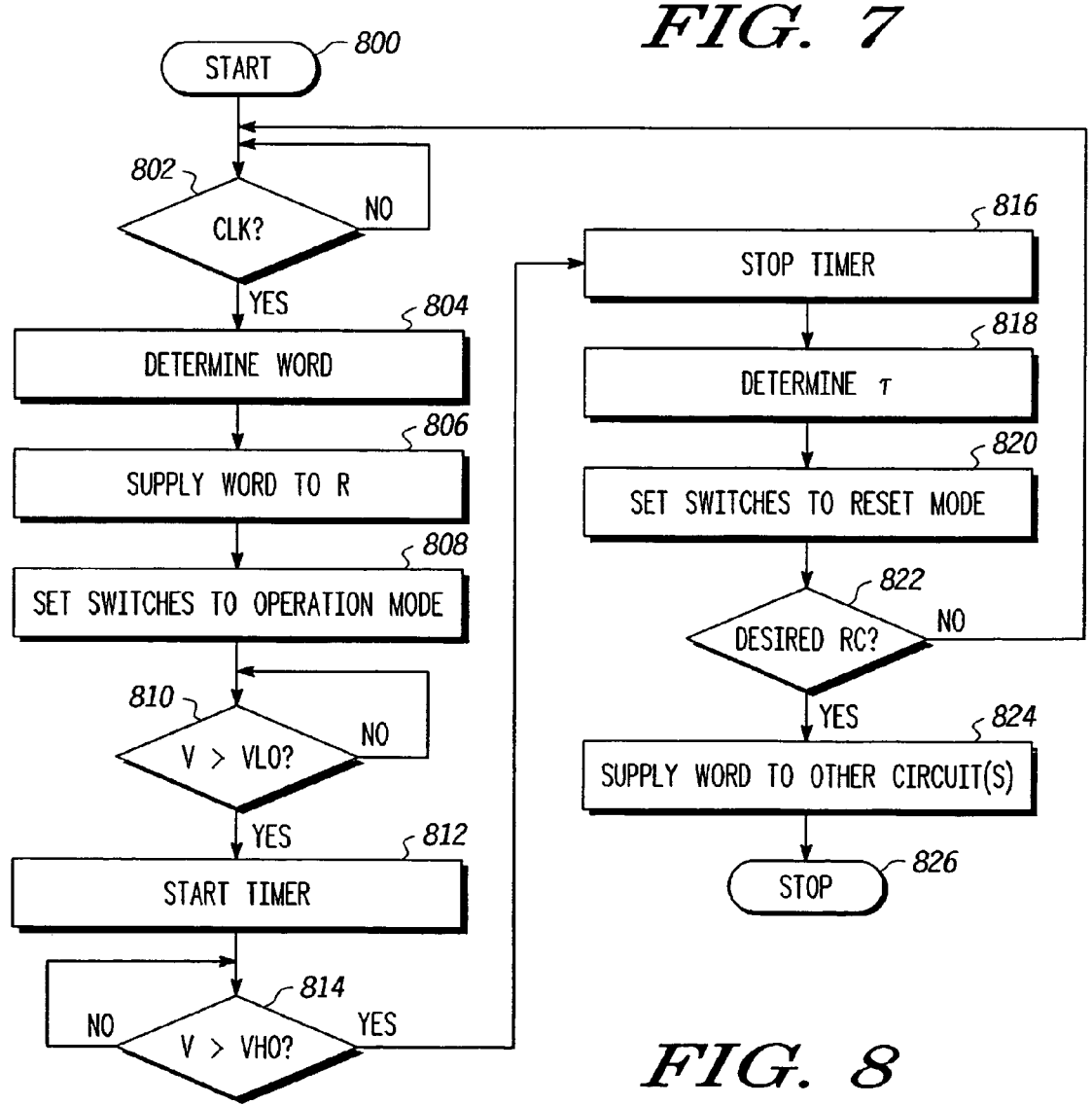
FIG. 8 is a flowchart of operation of the tracking oscillator according to the first embodiment.

In one embodiment, the process proceeds as shown in FIG. 8. After the start 800, the controller 616 waits until it receives a clock signal CLK in block 802. In the operation mode, the controller 616 determines the appropriate word in block 804 and supplies the word to the programmable resistor 604 in block 806. The controller 616 also controls the first and second reset switches 610 and 618 such that the first reset switch 610 is open and the second reset switch 618 is closed in block 808. That is, the controller 616 permits the reference pulse to be supplied to the inverting input of the integrator 602 and feedback to be supplied through the capacitor 606 but not through the feedback resistor 608.

Figure 7:
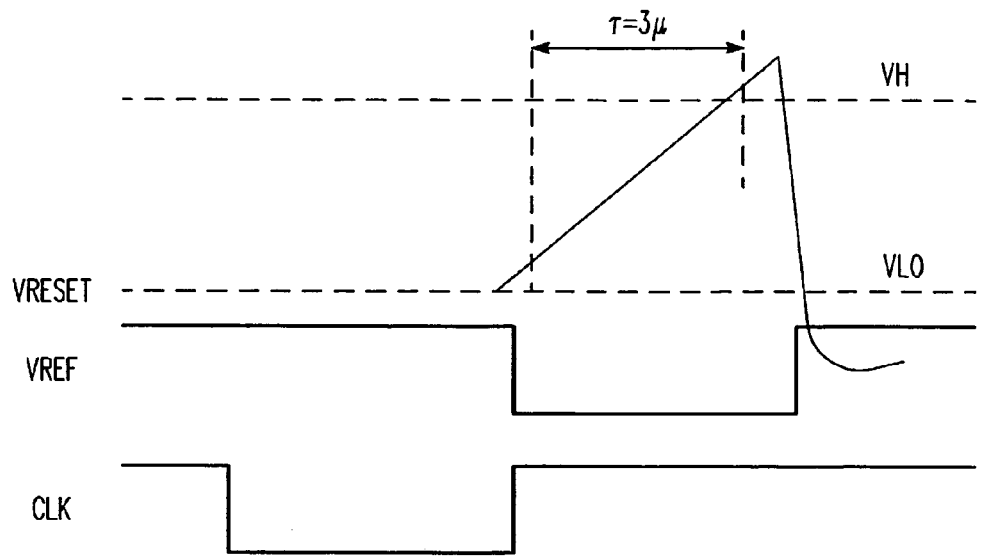
FIG. 7 shows a timing diagram of the output of the tracking oscillator according to one embodiment.

As the reference pulse Vref is supplied to the integrator 602, the capacitor 606 charges up from the reset voltage Vreset, thereby linearly increasing the voltage on the output of the integrator 602 as shown in FIG. 7. When the voltage on the output of the integrator 602 is lower than the low transition voltage Vlo, the outputs of the first and second comparators 612 and 614 are negative. As the voltage increases, when the voltage on the output of the integrator 602 becomes higher than the low transition voltage Vlo but is still lower than the high transition voltage Vh, the output of the first comparator 612 becomes positive while the output of the second comparator 614 remains negative. The controller 616 detects that the voltage on the output of the integrator 602 becomes higher than the low transition voltage Vlo in block 810 and starts a timer (not shown) in the controller 616 in block 812.

When the voltage on the output of the integrator 602 becomes higher than the high transition voltage Vh, the outputs of the first and second comparators 612 and 614 become positive. The controller 616 detects that the voltage on the output of the integrator 602 becomes higher than the high transition voltage Vh in block 814 and stops the timer in block 816.

When the outputs of the first and second comparators 612 and 614 become positive, the controller 616 determines τ in block 818 and triggers a reset mode in block 820. In the reset mode, the controller 616 closes the first reset switch 610 so that the feedback resistor 608 is connected between the output and the inverting input of the integrator 602. In addition, the controller 616 controls the second reset switch 618 such that the reset voltage Vreset is supplied to the inverting input of the integrator 602. This permits the capacitor 606 to rapidly discharge through the feedback resistor 608 and the voltage on the output of the integrator 602 to return to the reset voltage Vreset.

As shown in FIG. 7, the characteristic time constant τ, is determined by the values of the programmable resistor 604 and the capacitor 606, as well as the reset voltage Vreset and reference voltage Vref and the low and high transition voltages Vlo and Vh. More specifically the characteristic time constant τ is given by equation 1:

$$\tau = RC \, (Vh-Vlo)/(Vreset-Vref) = k \, RC \tag{1}$$

As all of the voltages are predetermined values, this means that the characteristic time constant τ is a constant times the product of the resistance of the programmable resistor 604 and the capacitance of the capacitor 606. For example, in one embodiment the voltages are set such that τ=5 RC=3 μs.

Back to FIG. 8, the controller 616 determines whether or not the programmable resistor 604 has been adjusted to provide the desired characteristic time constant τ in block 822. If the programmable resistor 604 is to be further adjusted, the controller 616 waits for the next clock signal CLK before adjusting the programmable resistor 604. If the programmable resistor 604 has been adjusted to provide the desired characteristic time constant I, the controller 616 supplies the word used to set the programmable resistor 604 to the appropriate resistance value to the other RC filters 140 and 150 or programmable current source 160 in block 824 and then ends in block 826.

The order of the blocks in FIG. 8 may be changed in various ways without altering the basic method of programming the other RC filters 140 and 150 or programmable current source 160.

Figure 9:
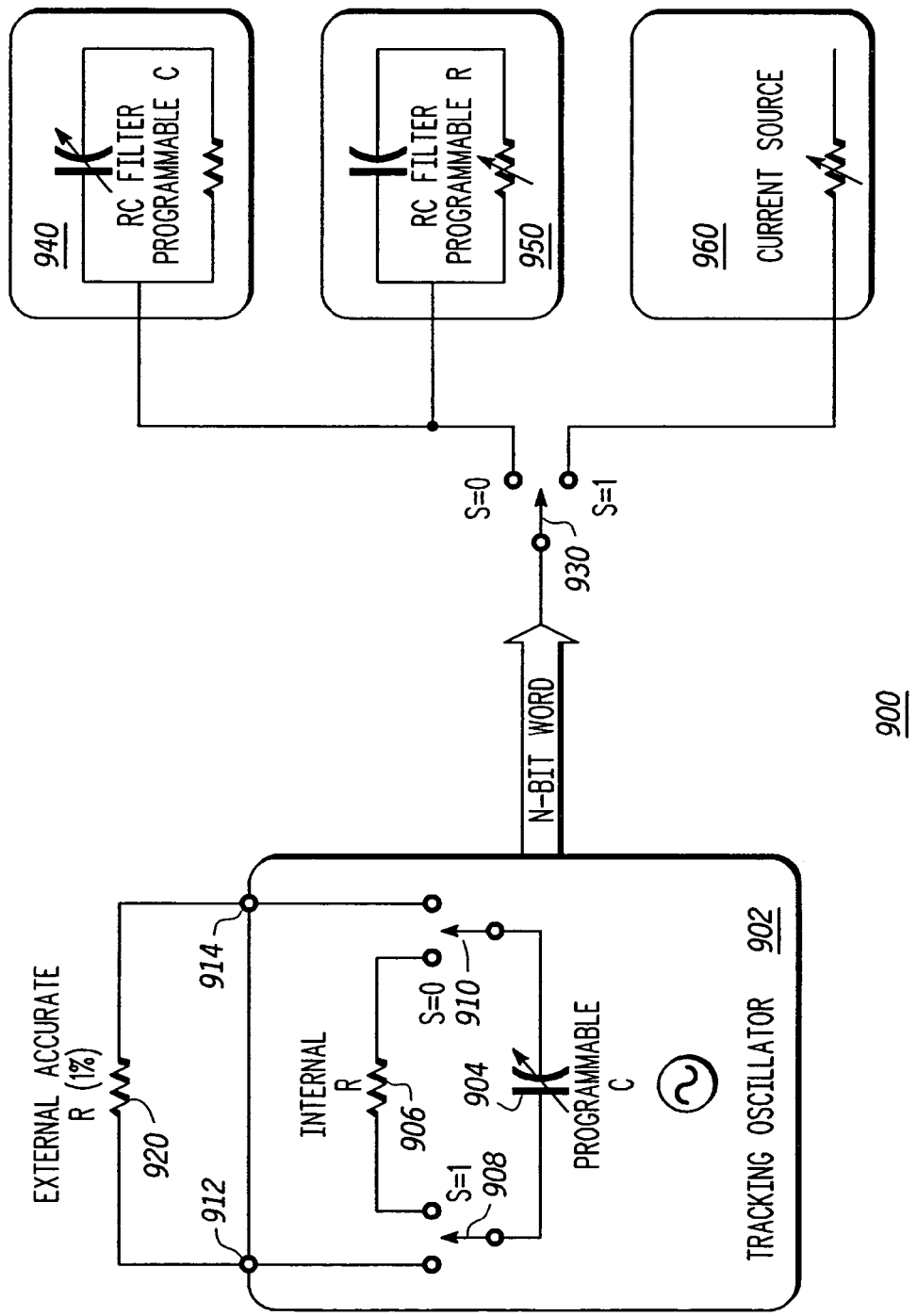
FIG. 9 illustrates a tracking apparatus according to a second embodiment.

In another embodiment, a programmable capacitor may be used rather than a programmable resistor. This embodiment is shown in FIG. 9. The tracking apparatus 900 of FIG. 9 contains a tracking oscillator 902 and connections to other programmable RC filters 940 and 950 or to one or more programmable current sources 960 through a switch 930. The tracking oscillator 902 includes a programmable capacitor 904, an internal resistor 906 (also referred to as supply resistor), and a pair of switches 908 and 910. The resistors and capacitors in the other programmable RC filters 940 and 950 are all fabricated at the same time, using the same processes as the programmable capacitor 904 and internal resistor 906 of the internal RC filter. Thus, there is little if any variation between the characteristics of the resistors and capacitors in the other programmable RC filters 940 and 950 and the programmable capacitor 904 and internal resistor 906 of the internal RC filter.

Also, the programmable current source 960 uses a resistor that is fabricated at the same time, using the same processes as the internal resistor 906 in the internal RC filter. Thus, there is little if any variation between the characteristics of the resistor in the programmable current source 960 and the internal resistor 906 in the tracking oscillator 902.

The switch 930 is controlled by the same signal that controls the switches 908 and 910 in the tracking oscillator 902. The switch 930 switches the connection between the tracking oscillator 902 and the other programmable RC filters 940 and 950 when the programmable capacitor 904 and internal resistor 906 are connected together to form the internal RC filter. Similarly, the tracking oscillator 902 is connected to the programmable current source 960 when the programmable capacitor 904 and the external capacitor 920 are connected together to form the hybrid RC filter.

The external resistor 920 is an individual component connected to input/output terminals 912 and 914 of the tracking oscillator 902. The external resistor 920 is extremely accurate (about <1%), that is, the value of the resistance does not vary by more than about 1% from the stated resistance of the external resistor 920. This permits the hybrid RC filter to contain at least one component whose value is precise and thereby track the values of the programmable current source 960.

When the tracking oscillator 902 and the other programmable RC filters 940 and 950 are connected together, the tracking oscillator 902 provides a first N-bit word to the other programmable RC filters 940 and 950 in a manner similar to that already described. When the tracking oscillator 902 is connected to the programmable current source 960, the tracking oscillator 902 provides a second N-bit word to the programmable current source 960. In this case, however, since the programmable current source 960 does not contain a capacitor, the absolute value of the capacitance of the programmable capacitor 904 is obtained, and then the difference between the actual value of the resistance of the internal resistor 906 and the desired resistance value is calculated using the first and second words. The second word is then determined and supplied to the programmable current source 960.

Figure 10:
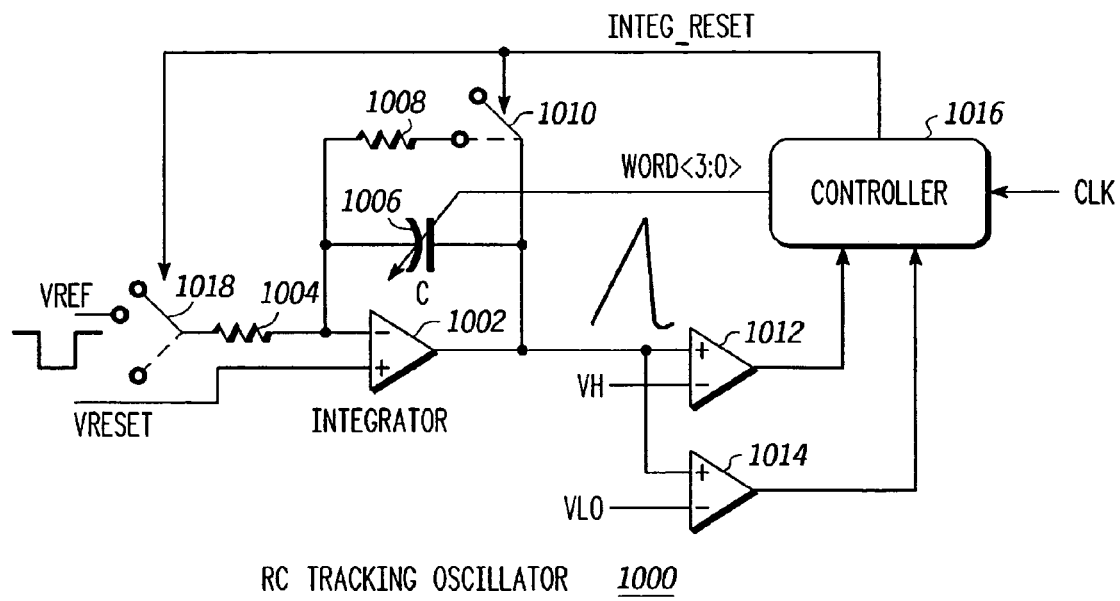
FIG. 10 shows a tracking oscillator according to the second embodiment.

FIG. 10 illustrates an embodiment of a tracking oscillator 1000. The tracking oscillator 1000 contains an integrator 1002, the programmable capacitor 1006, the external resistor 1004, a feedback resistor 1008, a first reset switch 1010, a pair of comparators 1012 and 1014 (first and second comparators), a controller 1016, and a second reset switch 1018.

The integrator 1002 and comparators 1012 and 1014, in one embodiment, are operational amplifiers (op-amps). A predetermined reset voltage Vreset is applied to the non-inverting input of the integrator 1002 and a reference pulse Vref is applied to the inverting input of the integrator 1002 through the second reset switch 1018 and the external resistor 1004. The programmable capacitor 1006 is connected between the output and the inverting input of the integrator 1002 to provide feedback. In addition, a series circuit containing the feedback resistor 1008 and the first reset switch 1010 is connected in parallel with the programmable capacitor 1006 between the output and the inverting input of the integrator 1002.

The output of the integrator 1002 is supplied to the non-inverting inputs of the comparators 1012 and 1014. A predetermined high transition voltage Vh is supplied to the inverting input of the first comparator 1012 and a predetermined low transition voltage Vlo is supplied to the inverting input of the second comparator 1014. The output of the first and second comparators 1012 and 1014 are supplied to the controller 1016. A clock signal CLK is also supplied to the controller 1016. In response to the clock signal CLK and the outputs from the first and second comparators 1012 and 1014, the controller 1016 supplies the word to the external resistor 1004 and a reset signal Integ_reset to the first and second reset switches 1010 and 1018.

Figure 11:
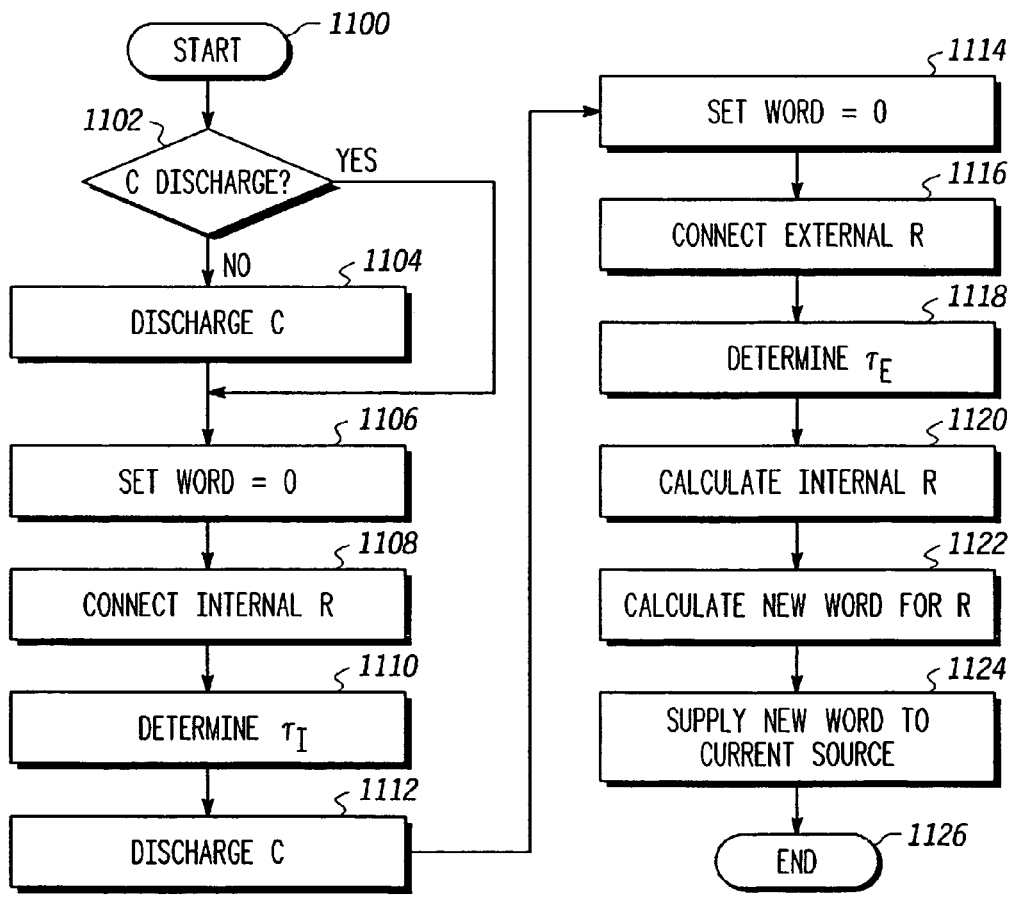
FIG. 11 is a first flowchart of operation of the tracking oscillator according to the second embodiment.

The process for programming the current source 960 proceeds as shown in FIG. 11 (the process for programming the other programmable RC filters 940 and 950 is similar to that in FIG. 8 and thus will not be further discussed). After the start 1100, the controller 1016 determines if the programmable capacitor 1006 has been discharged in block 1102. If the programmable capacitor 1006 has not been discharged in block 1102, the controller 1016 discharges the programmable capacitor 1006 in block 1104 using the reset mode described above. After the programmable capacitor 1006 has been discharged, the controller 1016 sets the word to be 0 in block 1106. The programmable capacitor 1006 and internal resistor 1004 are connected in block 1108 and the internal time constant $\tau_I$ is determined in block 1110 in a manner similar to that provided in FIG. 8.

The programmable capacitor 1006 is then discharged in block 1112 and the controller 1016 sets the word to be 0 in block 1114. The external resistor 920 is connected to the programmable capacitor 1006 in block 1116 and the external time constant $\tau_E$ is determined in block 1118 again in a manner similar to that provided in FIG. 8.

The controller 1016 calculates the resistance of the internal resistor 904 in block 1120, determines the appropriate word to supply to the programmable current source 960 in block 1122, and supplies the new word to programmable current source 960 in block 1124 before terminating in block 1126. The controller 1016 calculates the resistance of the internal resistor 904 in block 1120 via the following equations. From equation 1:

$$\tau_I = k\, R_I C_I \tag{2}$$

and $$\tau_E = k\, R_E C_I \tag{3}$$

Dividing the two equations and rearranging, we get $$R_I = R_E(\tau_I/\tau_E) \tag{4}$$

Thus, since $R_E$ is a highly accurate resistance value and $\tau_I$ and $\tau_E$ are measured values, $R_I$ can be easily calculated. Now since:

$$R_I = R_N + \Delta R \tag{5}$$

where $R_N$ is the known nominal, designed resistance and $\Delta R$ is the variation, the word W applied to program the programmable current source 960 is:

$$W = R_N - R_I = -\Delta R = R_N - R_E(\tau_I/\tau_E) \tag{6}$$

Of course, any word may be supplied by the controller 1016 when either time constant is being determined to calculate the appropriate word to supply to the programmable current source 960. For example, the same word used to program the other RC filters 940 and 950 may be used to determine the absolute value of the capacitance. Different words may also be used.

In the embodiments shown, a single circuit tracking oscillator may be used to determine variations in the resistances and capacitances of multiple integrated RC filters (i.e. track RC poles) in transmitters or receivers in electronic devices. The use of a single circuit can reduces the die size and current used by of such circuitry to program the other circuits.

The tracking apparatus employs a programmable capacitor and fixed resistor or a programmable resistor and fixed capacitor. When the same R and C technology is used for both the tracking circuit and the circuit to be adjusted, a single circuit and the same digital code word can be used to track both sets of poles. In addition, an on-chip programmable resistor or capacitor can be used with an accurate (1%) off-chip capacitor or resistor, respectively, to track a current source to generate accurate (eg. 10%) currents on-chip. The off-chip components can be used elsewhere and multiplexed in for programming, since this tracking circuitry is used intermittently. The tracking oscillator tracks the resistance to within 10% (or less), which is then used in a current source to track the current within ±10% (or less).

Tracking may be performed in a number of different ways. For example, tracking may be performed immediately after fabrication is completed or whenever power is initially applied to the integrated circuit (power-up). Alternatively, if the tracking apparatus is disposed in a cell phone, for example, tracking may occur whenever the channel changes or whenever it is desirable to make a call. In addition, tracking may occur at designated time intervals during use, so that the elements are tracked as the device operates.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

I claim:

1. An integrated circuit comprising:
   a tracking oscillator containing a programmable first integrated RC filter having a first pole that varies from a first designed value by a first difference and a first programmable element in the first RC filter that varies from a second designed value by a second difference;
   a first programmable circuit containing a second integrated RC filter having a second pole that varies from the first designed value by the first difference;
   a second programmable circuit containing a second programmable element that varies from the second designed value by the second difference; and
   an external element and switches connected between the external element and the first programmable element, the external element and the first programmable element forming a hybrid RC filter when the second programmable circuit is to be programmed, and the external element and the first programmable element disconnected from each other when the first programmable circuit is to be programmed,
   wherein the tracking oscillator is connectable to the first programmable circuit for providing information for programming the second RC filter using the first difference and the tracking oscillator is connectable to the second programmable circuit for providing information for programming the second programmable element using the second difference.

2. The integrated circuit of claim 1, wherein the tracking oscillator comprises:
   an integrator having an input to which a reference pulse is supplied via a resistor and an output to which a capacitor is connected; and
   a controller that programs at least one of the resistor or the capacitor in response to a charging time of the capacitor.

3. The integrated circuit of claim 1, wherein the first and/or second programmable element is a capacitor.

4. The integrated circuit of claim 1, wherein the first and/or second programmable element is a resistor.

5. The integrated circuit of claim 1, wherein the second programmable circuit is a programmable current source.

6. An integrated circuit comprising:
   a tracking oscillator containing a first integrated RC filter, the first RC filter containing programmable and fixed elements that define a first pole of the first RC filter, the first pole varying from a first designed value by a first difference;
   a plurality of programmable circuits each containing a second integrated RC filter having programmable and fixed elements defining a second pole of the second RC filter, the second pole varying from a second designed value by a second difference, the programmable and fixed elements of the programmable circuit having been fabricated at the same time as the programmable and fixed elements of the tracking oscillator such that the second pole varies from the second designed value in the same proportion as the first pole varies from the first designed value; and
   an external element and switches connected between the external element and the programmable element in the tracking oscillator, the external element and the programmable element forming a hybrid RC filter when the current source is to be programmed, and the external element and the programmable element disconnected from each other when the programmable circuits are to be programmed,
   wherein the tracking oscillator determines programming information for programming the programmable elements in the programmable circuits based upon the first difference and provides the programming information for programming the programmable elements in the programmable circuits.

7. The integrated circuit of claim 6, wherein the tracking oscillator comprises:
   an integrator having an input to which a reference pulse is supplied via a resistor and an output to which a capacitor is connected; and
   a controller that programs at least one of the resistor or the capacitor in response to a charging time of the capacitor.

8. The integrated circuit of claim 6, wherein the programmable element in the tracking oscillator is a capacitor and the programmable element in at least one of the programmable circuits is a capacitor.

9. The integrated circuit of claim 6, wherein the programmable element in the tracking oscillator is a capacitor and the programmable element in at least one of the programmable circuits is a resistor.

10. The integrated circuit of claim 6, wherein the programmable element in the tracking oscillator is a resistor and the programmable element in at least one of the programmable circuits is a capacitor.

11. The integrated circuit of claim 6, wherein the programmable element in the tracking oscillator is a resistor and the programmable element in at least one of the programmable circuits is a resistor.

12. The integrated circuit of claim 6, further comprising a programmable current source programmable by the tracking oscillator.

13. A method of programming a plurality of programmable circuits that each have a first RC filter having a first pole that varies in the same manner from a first designed value, the method comprising:
 determining programming information, based on a charge time of the capacitor in the first RC filter, to supply to a programmable element within a second RC filter of a tracking oscillator to adjust a second pole of the second RC filter to within a predetermined tolerance of a designed value, the second RC filter having a programmable element and a fixed element;
 programming the programmable circuits using the programming information, each first pole varying from the first designed value in the same proportion as the second pole of the second RC filter varies from the second designed value, each first RC filter having a programming element and a fixed element, the programming and fixed elements of each first RC filter having been fabricated at the same time as the programming and fixed elements of the tracking oscillator;
 programming a programmable current supply, the current supply having a programmable element that varies from a third designed value in proportion to a variation of the programmable element of the tracking oscillator from a fourth designed value;
 programming of the current supply comprising:
  supplying a first word to the second RC filter;
  connecting an external element to the programmable element of the tracking oscillator to form a hybrid RC filter;
  supplying a second word to the hybrid RC filter:
  calculating a third word to supply to the programming element of the current supply from results of supplying the first and second words; and
  supplying the third word to the current source to program the current source.

14. The method of claim 13, determining the programming information comprising:
 setting an initial word;
 supplying the first word to the programmable element of the tracking oscillator;
 calculating a characteristic time constant of the second RC filter programmed using the initial word;
 determining whether the initial word has programmed the programmable element to within the predetermined tolerance;
 if the first word has programmed the programmable element to within the predetermined tolerance, programming the programmable circuits using the initial word, if not, repeating the supplying, calculating and determining until the programmable element of the second RC filter is programmed to within the predetermined tolerance.

15. The method of claim 13, wherein programming the current source further comprises:
 determining a first time constant of the second RC filter when the first word is supplied to the first RC filter;
 determining a second time constant of the hybrid RC filter when the second word is supplied to the hybrid RC filter; and
 calculating the third word to supply to the programming element of the programmable current supply using the first and second time constants.

16. The method of claim 13, wherein the programmable element in the tracking oscillator is a capacitor and the programmable element in at least one of the programmable circuits is a capacitor.

17. The method of claim 13, wherein the programmable element in the tracking oscillator is a capacitor and the programmable element in at least one of the programmable circuits is a resistor.

18. The method of claim 13, wherein the programmable element in the tracking oscillator is a resistor and the programmable element in at least one of the programmable circuits is a capacitor.

19. The method of claim 13, wherein the programmable element in the tracking oscillator is a resistor and the programmable element in at least one of the programmable circuits is a resistor.

20. The integrated circuit according to claim 1, wherein the tracking oscillator is operable to program the programmable element in response to a charge time of a capacitance of the RC filter.

* * * * *